United States Patent
Kwon

(10) Patent No.: US 8,171,233 B2
(45) Date of Patent: May 1, 2012

(54) MULTI PORT SEMICONDUCTOR MEMORY DEVICE WITH DIRECT ACCESS FUNCTION IN SHARED STRUCTURE OF NONVOLATILE MEMORY AND MULTI PROCESSOR SYSTEM THEREOF

(75) Inventor: Jin-Hyung Kwon, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 625 days.

(21) Appl. No.: 12/368,739

(22) Filed: Feb. 10, 2009

(65) Prior Publication Data
US 2009/0228638 A1     Sep. 10, 2009

(30) Foreign Application Priority Data
Mar. 7, 2008   (KR) .................. 10-2008-0021221

(51) Int. Cl.
*G06F 12/00* (2006.01)
*G06F 15/167* (2006.01)
(52) U.S. Cl. ........ 711/147; 709/212; 709/213; 709/214; 711/103; 711/130; 711/149; 711/152; 711/153; 711/163; 711/E12.001; 711/E12.008
(58) Field of Classification Search ............. 709/212, 709/213, 214; 711/103, 130, 147, 148, 149, 711/152, 153, 163, E12.001, E12.008
See application file for complete search history.

(56) References Cited

U.S. PATENT DOCUMENTS

| | | | | |
|---|---|---|---|---|
| 4,943,911 A * | 7/1990 | Kopp et al. | | 713/2 |
| 5,202,997 A * | 4/1993 | Arato | | 726/34 |
| 7,320,054 B2 * | 1/2008 | Matsuura et al. | | 711/141 |
| 7,730,268 B2 * | 6/2010 | Maheshwari et al. | | 711/154 |
| 2003/0093628 A1 * | 5/2003 | Matter et al. | | 711/153 |
| 2004/0107264 A1 * | 6/2004 | Nishida | | 709/213 |
| 2007/0136536 A1 | 6/2007 | Byun et al. | | |
| 2008/0244156 A1 * | 10/2008 | Patel | | 711/100 |
| 2009/0217280 A1 * | 8/2009 | Miller et al. | | 718/104 |
| 2011/0066814 A1 * | 3/2011 | Narisawa et al. | | 711/147 |

FOREIGN PATENT DOCUMENTS

| | | | |
|---|---|---|---|
| JP | 8161283 | * | 6/1996 |
| JP | 2007-183705 | | 7/2007 |
| KR | 10-0751094 | | 8/2007 |

OTHER PUBLICATIONS

English Abstract for Publication No. 2007-183705.
English Abstract for Publication No. 10-0751094.

* cited by examiner

*Primary Examiner* — Kevin Ellis
*Assistant Examiner* — Mehdi Namazi
(74) *Attorney, Agent, or Firm* — F. Chau & Associates, LLC

(57) ABSTRACT

A multiport semiconductor memory device and a multiprocessor system employing the same directly accesses a shared nonvolatile memory. The multiport semiconductor memory device includes a plurality of port units coupled with respective corresponding processors. A shared memory area is accessed by both the processors through the port units. A data path control unit controls a data path between the shared memory area and the port units and data transmission/reception is performed between the processors through the shared memory area. An access authority information storage unit is positioned outside of the memory cell array and stores information for an access authority of nonvolatile memory and provides the information to the processors. Accordingly, a direct access is performed by a processor indirectly connected to nonvolatile memory.

17 Claims, 10 Drawing Sheets

MULTI PORT SEMICONDUCTOR MEMORY DEVICE WITH DIRECT ACCESS FUNCTION IN SHARED STRUCTURE OF NONVOLATILE MEMORY AND MULTI PROCESSOR SYSTEM THEREOF

CROSS-REFERENCE TO RELATED APPLICATIONS

This application claims priority under 35 U.S.C. §119 to Korean Patent Application 10-2008-0021221, filed on Mar. 7, 2008, the contents of which are herein incorporated by reference in its entirety.

BACKGROUND

1. Technical Field

The present invention relates to multiport semiconductor memory devices, and more particularly, to a multiport semiconductor memory device providing a direct access function in a shared structure of nonvolatile memory, and a multiprocessor system employing the same.

2. Discussion of the Related Art

Modern electronic systems, for example mobile communications systems such as portable media players (PMPs), handheld phones and personal digital assistants (PDAs), are increasingly being called upon to handle complex functions. For example, a handled phone may be able to play back encoded music, run video games, take pictures and video, access the Internet, process payments and more. These devices must be able to provide a stable and predictable performance. In order to perform these and other sophisticated functions, the device may include an application processor. The application processor may be in addition to a communication processor that may perform modulation/demodulation functionality central to the ability of the device to communicate with the wireless network. The application processor and the communication processor may coexist on a single printed circuit board (PCB) within the mobile device.

In such mobile systems, a semiconductor memory may be used to store data for use by both the communication processor and the application processor. Accordingly, the memory may include a plurality of access ports so that the memory may be simultaneously read from and written to by various processes executed on both the communication processor and the application processor.

In general, a semiconductor memory device having two access ports is called a dual-port memory. A typical dual-port memory has been well known in the field as an image processing video memory having a RAM port accessible in a random sequence and a SAM port accessible only in a serial sequence. Unlike the configuration of the video memory mentioned above, a dynamic random access memory (DRAM) does not employ a SAM port. The DRAM may have a shared memory area that is accessible by respective processors through a plurality of access ports. Such a DRAM is known as a multiport semiconductor memory device or multipath accessible semiconductor memory device.

An example of a shared memory area of a DRAM is shown in FIG. 1. United States Patent application publication No. US 2003/0093628, ("Matter et. al."), which is hereby incorporated by reference, includes a description of such a shared memory area and describes memory adequate to such multiprocessor system.

FIG. 1 illustrates a block diagram of a multiprocessor system according to the conventional art. A memory array 35 is constructed of first, second and third portions 33, 31, and 32. In the multiprocessor system 50, the first portion 33 of the memory array 35 is accessed only by a first processor 81 through a first port 37, and the second portion 31 is accessed only by a second processor 80 through a second port 38, and the third portion 32 is accessed by both the first and second processors 70 and 80. The size of the first and second portions 33 and 31 of the memory array 35 may be changed depending upon an operation load of the first and second processors 70 and 80, and the type of memory array 35. The memory array 35 shown herein is a memory type or disk storage type memory array.

Accordingly, in techniques of the conventional art, it may not be possible for each of the processors to directly access each of the portions of the memory array.

SUMMARY

Exemplary embodiments of the present invention may provide for a multiport semiconductor memory device that is able to have multiple processors directly communicating with multiple shared memory arrays, where the shared memory arrays may include nonvolatile memory.

The nonvolatile shared memory may be used to store instructions that are used to perform system booting in a system that includes multiple processors. The system may be, for example, a mobile communication device such as a portable telephone or a portable wireless computer device. The multiple processors may include a modem processor for handling modem communications and an application processor for handling other functions, such as data processing functions, entertainment functions, and/or other functions commonly associated with smart phones and other mobile computer systems.

Exemplary embodiments of the present invention provide a multiport semiconductor memory device and a multiprocessor system employing the same, in which a nonvolatile memory may be shared by multiple processors that may each have direct access to the shared memory. The shared nonvolatile memory may also be used to directly boot one or more of the multiple processors.

Some exemplary embodiments of the present invention provide a multiport semiconductor memory device and a multiprocessor system. The nonvolatile semiconductor memory device may be accessed by each of the multiple processors using a common access method, which is capable of performing direct booting and direct writing through a DRAM interface without a serial interface between the multiple processors. In the multiprocessor system, communication codes frequently updated during the operation of the system can be directly written to a flash memory without having to be routed through a corresponding processor.

Some exemplary embodiments of the present invention provide a multiport semiconductor memory device and a multiprocessor system capable of performing direct access through a processor indirectly connected to a nonvolatile memory without the use of a host interface in a shared structure of nonvolatile memory. Accordingly, direct booting and a direct storage of code data may be achieved. Such devices and techniques can provide a reliable and secure sharing of nonvolatile memory and access collision between the multiple processors in accessing the shared memory may be prevented.

According to an exemplary embodiment of the present invention, a multiport semiconductor memory device includes a plurality of port units coupled with respective corresponding processors. A shared memory area is accessed in common by the processors through the port units and is assigned in a predetermined memory capacity unit of the memory cell array. A data path control unit controls a data path between the shared memory area and the port units and performs data transmission/reception between the processors through the shared memory area. An access authority information storage unit is positioned outside the memory cell array, for storing information for an access authority of nonvolatile memory and for providing the information to the processors.

The multiport semiconductor memory device may further include dedicated memory areas accessed exclusively by the respective processors in the memory cell array. The data path control unit may be positioned outside the memory cell array and include an internal register that can be accessed by all of the processors. Further, the access authority information storage unit includes an internal register positioned outside the memory cell array that is accessed by all of the processors. The internal register may be constructed of a semaphore area for storing a control authority for the nonvolatile memory.

The internal register may include a latch type register that may be accessed instead of a specific area of the shared memory area when a specific address to access the specific area of the shared memory area is applied. The latch type register may store data for controlling the data path. The internal register may include a semaphore area for storing a control authority for the shared memory area, and individually assigned mailbox areas corresponding to the number of processors used, for storing a message to be applied to respective processors corresponding to a data transmission direction.

The predetermined memory capacity unit may be a memory bank unit, and the nonvolatile memory may be a NAND or NOR type flash memory.

According to an exemplary embodiment of the present invention, a multiprocessor system includes a first processor for performing a first task, a second processor for performing a second task, a nonvolatile memory connected to each of the processors, for storing a firmware related to the first and second processors, and a multiport semiconductor memory device including a plurality of port units individually connected to the processors. A shared memory area is accessed by each of the processors through the port units and is assigned in a predetermined memory capacity unit in a portion of memory cell array. A data path control unit controls a data path between the shared memory area and the port units and performs data transmission/reception between the processors through the shared memory area. An access authority information storage unit is positioned outside of the memory cell array, for storing information for an access authority of the nonvolatile memory and providing the information to the processors.

The first task may include a communication modulation/demodulation function, and the second task may include a function of processing application information.

The multiprocessor system may be a mobile communications system such as a portable media player (PMP), a mobile phone, or a personal digital assistant (PDA). The nonvolatile memory may be an EEPROM or a PRAM (Phase-change RAM).

According to an exemplary embodiment of the present invention, a method of accessing a nonvolatile semiconductor memory device in a multiprocessor system including a nonvolatile memory and a multiport semiconductor memory device connected with first and second processors individually performing first and second task, includes preparing a plurality of port units individually connected to corresponding processors, a shared memory area accessed by each of the processors through the port units and assigned in a predetermined memory capacity unit in a portion of memory cell array, and first and second storage units of a latch type for individually storing information for an access authority of the multiport semiconductor memory device and the nonvolatile memory. The first and second storage units are positioned outside the memory cell array. Booting is performed by accessing the nonvolatile semiconductor memory device by the second processor, and information to transfer an access authority to the second storage unit of the multiport semiconductor memory device is set to perform a booting of the first processor. The nonvolatile semiconductor memory device is directly accessed and thus data of the first processor is stored after the first processor has completed booting, without depending upon the second processor.

The first processor may be a modem processor and thus the data of the first processor may be MODEM code data.

As described above, according to some exemplary embodiments of the present invention, a processor indirectly connected to a nonvolatile memory can directly access the shared nonvolatile memory. Thus a host interface may be omitted, and direct booting and direct storage of code data can be obtained efficiently, thereby providing a high level of booting performance and a reduced level of power consumption of the system. In addition, a high degree of system reliability and security may be achieved and access collision between processors in accessing the nonvolatile memory can be prevented.

BRIEF DESCRIPTION OF THE DRAWINGS

The above and other features and aspects of the exemplary embodiments of the present invention will be described in detail with reference to the accompanying drawings, in which.

DETAILED DESCRIPTION OF THE EMBODIMENTS

Exemplary embodiments of the present invention are described more fully hereinafter with reference to FIGS. 2 to 10. This invention may, however, be embodied in many different forms and should not be construed as limited to the exemplary embodiments set forth herein.

According to some exemplary embodiments of the present invention, a multiport semiconductor memory device capable of providing a direct access function in a shared structure of nonvolatile memory, and a multiprocessor system employing the same, are described as follows, referring to the accompanied drawings.

To perform a direct access by a processor indirectly connected to a nonvolatile memory in a shared structure of nonvolatile memory, an access authority information storage unit is adapted according to an exemplary embodiment of the invention. The access authority information storage unit is positioned outside of a memory cell array in a multiport semiconductor memory device and stores information for an access authority of nonvolatile memory and provides the information to the processors. Accordingly, a processor indirectly connected to nonvolatile memory can directly access the nonvolatile memory with reference to the access authority information storage unit even when a processor directly connected to the nonvolatile memory is in a sleep mode.

Figure 1:
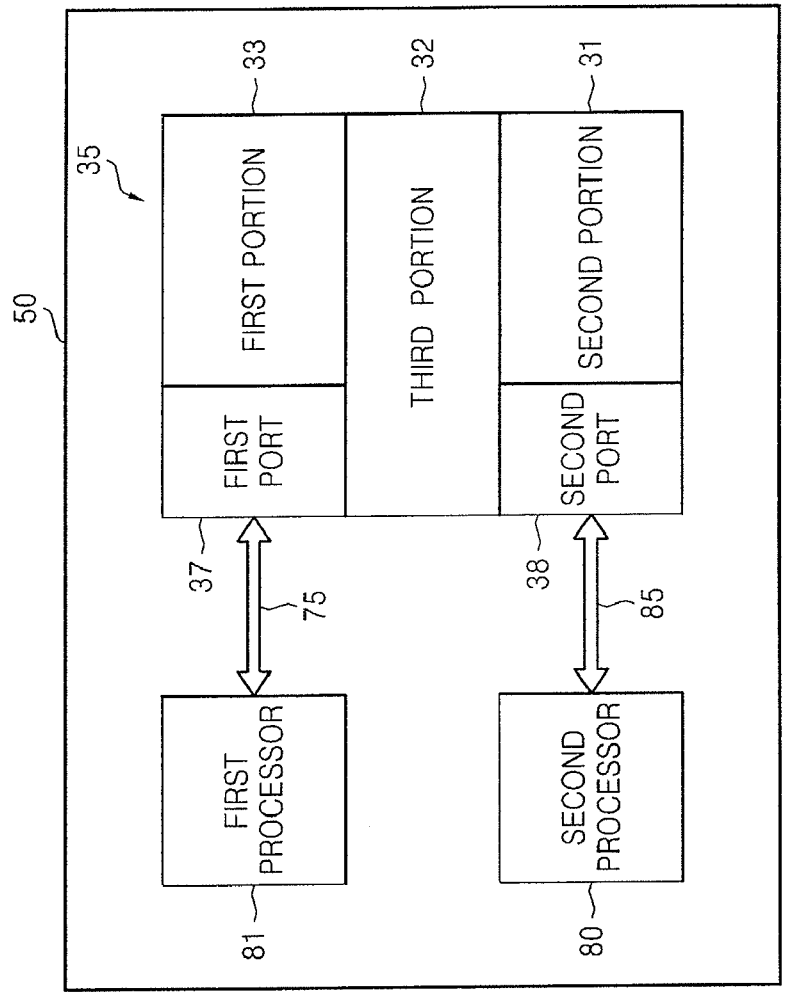
FIG. 1 is a block diagram of multiprocessor system according to the conventional art.
Figure 2:
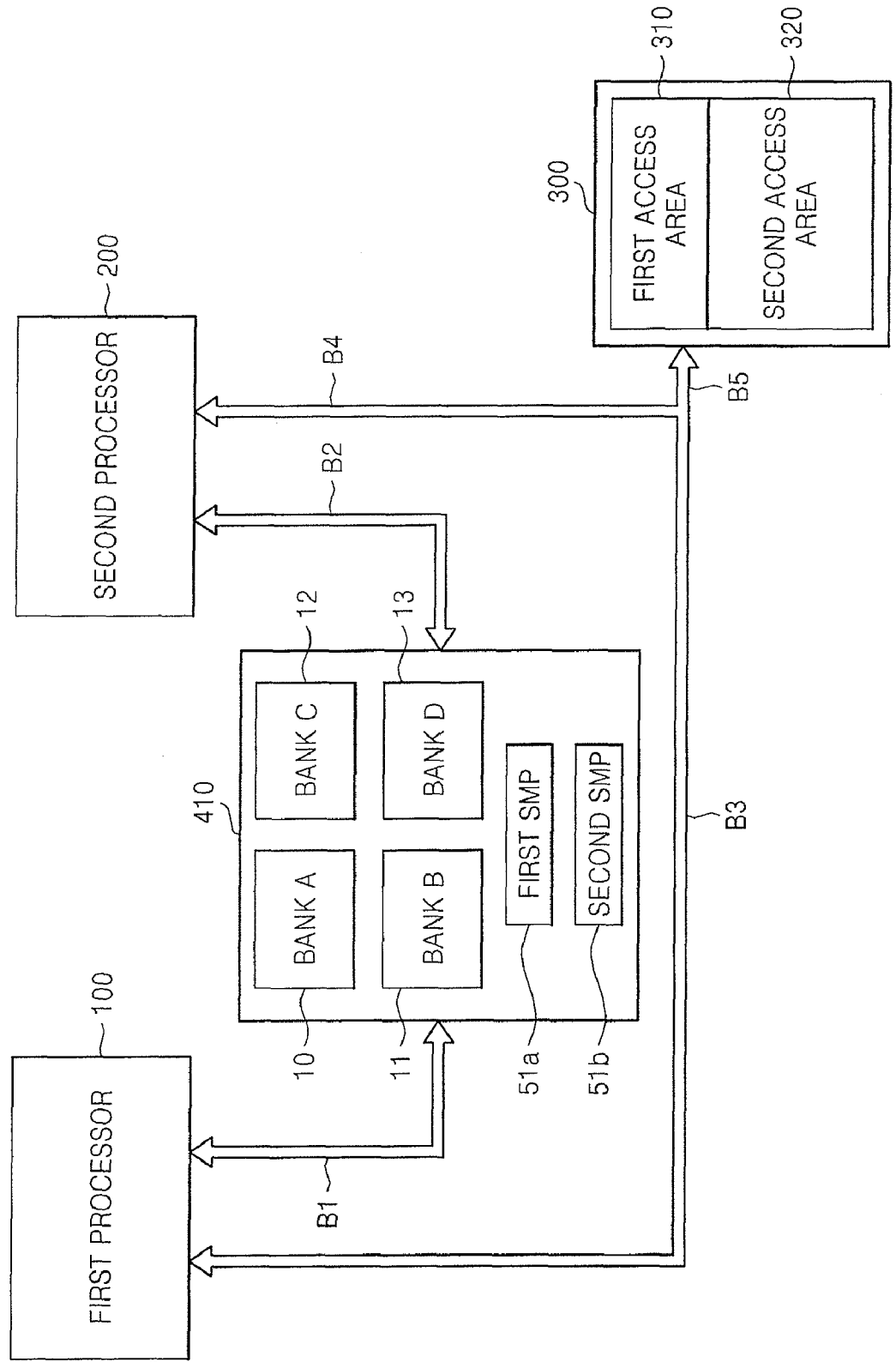
FIG. 2 is a block diagram illustrating a memory connection structure of multiprocessor system according to an exemplary embodiment of the present invention.

FIG. 2 is a block diagram illustrating a memory connection structure of multiprocessor system according to an exemplary embodiment of the present invention.

Figure 3:
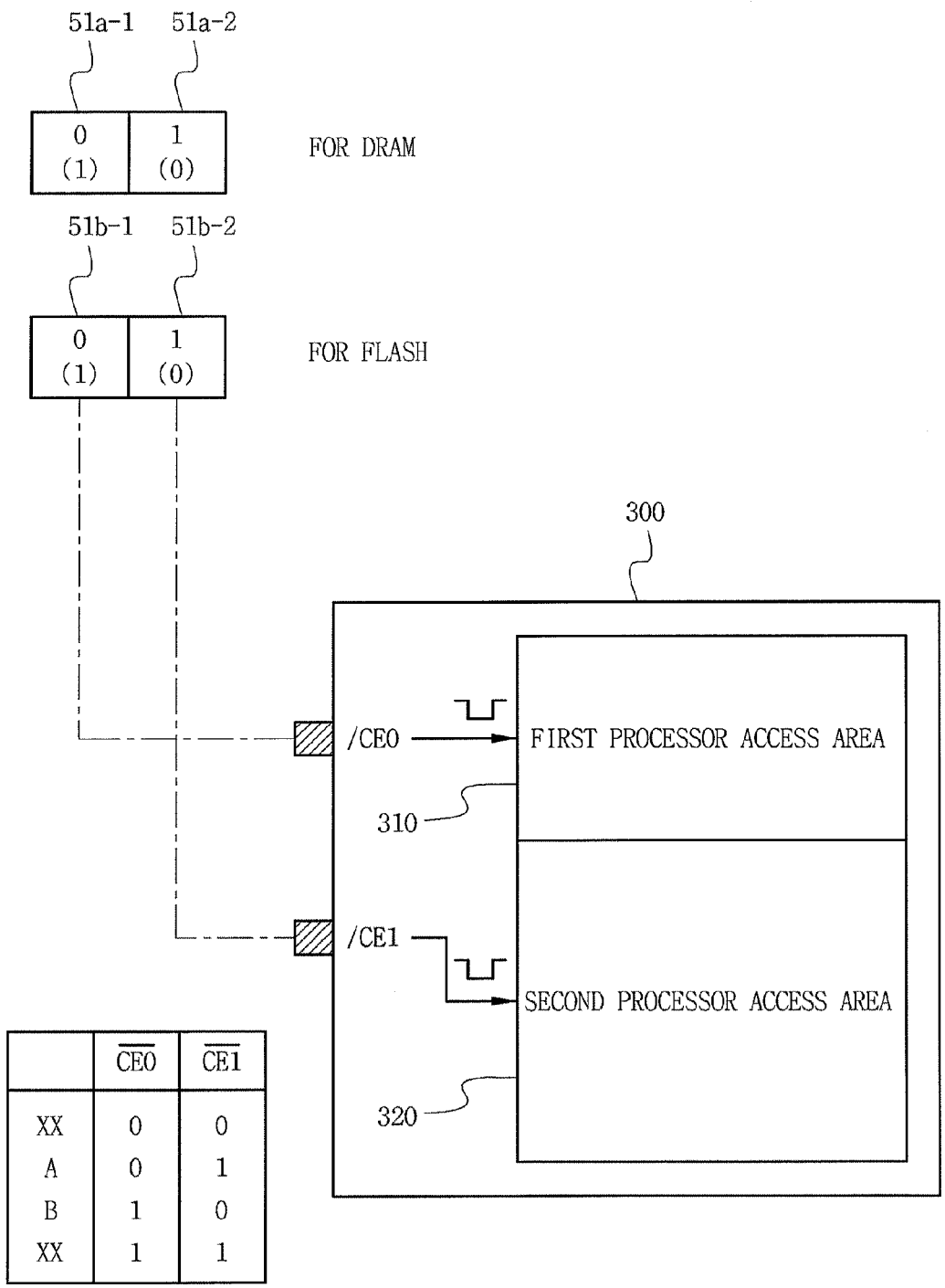
FIG. 3 is a block diagram illustrating a concept of direct access for a nonvolatile semiconductor memory of FIG. 2.

A universal asynchronous receiver/transmitter (UART) is a type of asynchronous receiver/transmitter, a device that translates data between parallel and serial forms. A Serial Peripheral Interface (SPI) bus is a synchronous serial data link standard that operates in full duplex mode. Devices along the SPI bus communicate in master/slave mode where the master device initiates the data frame. UART and/or SPI buses may be used in sharing a single memory device among multiple processors. Referring to FIG. 3, a host interface such as a UART/SPI interface etc. is omitted, and a bus line B3 is adapted between a first processor 100 and a flash memory 300.

Exemplary embodiments of the present invention may utilize four memory banks, bank A 10, bank B 11, bank C 12, and bank D 13, within a single memory cell array of a multiport semiconductor memory device 410. The multiport semiconductor memory device 410 may be coupled to multiple processors, for example, including a first processor 100 and a second processor 200, through system buses B1 and B2, respectively. The bank A 10 may function as a first dedicated memory area and may be accessed exclusively by the first processor 100. Banks C and D, 12 and 13, may function as second dedicated memory areas and may be accessed exclusively by second processor 200.

A bank B 11 is a shared memory area and has a connection structure that may allow for access by each of the first and second processors 100 and 200. For example, the bank B 11 is assigned as the shared memory area in the memory cell array.

The dedicated memory areas 10, 12 and 13, and the shared memory area 11 are all comprised of DRAM cells of which each DRAM cell is constructed of one access transistor and one storage capacitor. The DRAM cells require a refresh operation to preserve a storage charge within each cell.

Here the four memory areas 10, 11, 12 and 13 may each be configured within an individual bank unit of the DRAM, and one bank may have a memory storage of, for example, 16 Mb (Megabits), 32 Mb, 64 Mb, 128 Mb, 256 Mb, 512 Mb or 1024 Mb.

Nonvolatile memory, for example, the flash memory 300 is divided into a first access area 310 arranged corresponding to the first processor 100, and a second access area 320 arranged corresponding to the second processor 200. The nonvolatile memory may include a firmware F/W appropriate to enable use by the respective corresponding processors. The firmware is stored in the first and second access areas 310 and 320.

Access authority information for the shared memory area 11 is stored in a first semaphore area 51a and access authority information for the flash memory 300 is stored in a second semaphore area 51b.

The first processor 100 can read data stored in the flash memory 300 through the bus line B3 referring to the access authority information for the flash memory 300 stored in the second semaphore area 51b or the first processor 100 can write data to the flash memory 300 even when the second processor 200 is in a sleep mode.

In a shared memory connection structure such as shown in FIG. 2, the first processor 100 performs direct booting from the flash memory 300 and performs a direct access for the flash memory 300 without a host interface such as UART/SPI interface etc.

FIG. 3 is a block diagram illustrating a concept of direct access for a nonvolatile semiconductor memory of FIG. 2.

With reference to FIG. 3 there is shown the first semaphore area 51a and the second semaphore area 51b of FIG. 2, and first and second access areas 310 and 320 of the flash memory 300 which are accessed according to information stored in the second semaphore area 51b. For example, when data "01" is stored in information storage areas 51b-1 and 51b-2 of the second semaphore area 51b that stores access authority information for the flash memory 300, the first processor 100 has the authority to access the first access area 310 of the flash memory 300. Further, when data "10" is stored in information storage areas 51b-1 and 51b-2 of the second semaphore area 51b, the second processor 200 has the authority to access the second access area 320 of the flash memory 300. Letter codes /CE0 and /CE1 shown in FIG. 3 each indicate a chip enable pin. For example, when logic data applied to the chip enable pin /CE0, /CE1 of the flash memory 300 is provided as "01", the first access area 310 is accessed by the first processor 100.

Figure 4:
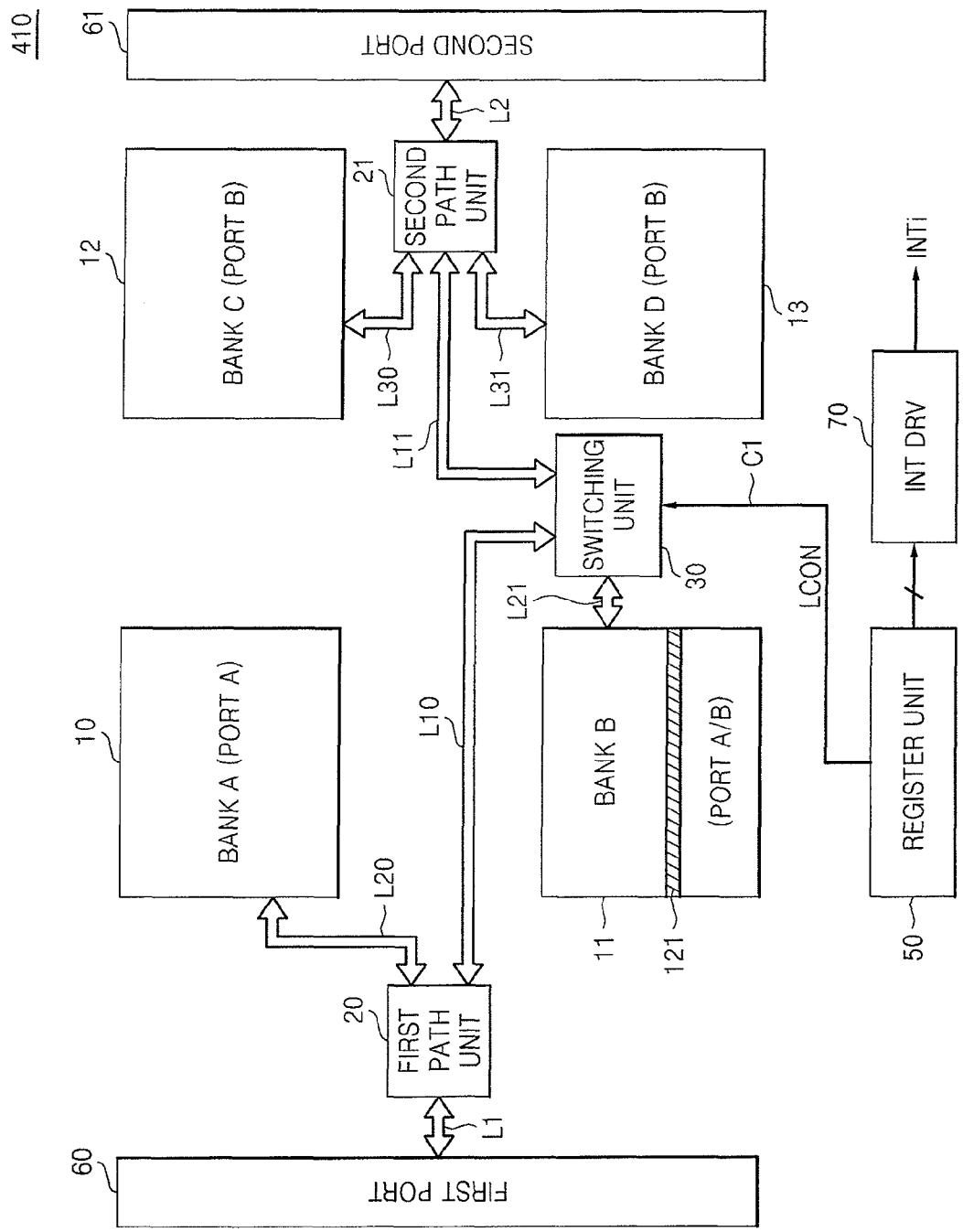
FIG. 4 is a block diagram illustrating in detail a multiport semiconductor memory device shown in FIG. 2.

FIG. 4 is a block diagram illustrating in detail a multiport semiconductor memory device 410. First and second ports 60 and 61 constitute port units. The port units are connected to corresponding processors 100 and 200.

The shared memory area 11 (bank B) may be accessed by either of the port units and is assigned in a predetermined memory capacity unit to a portion of memory cell array.

Figure 5:
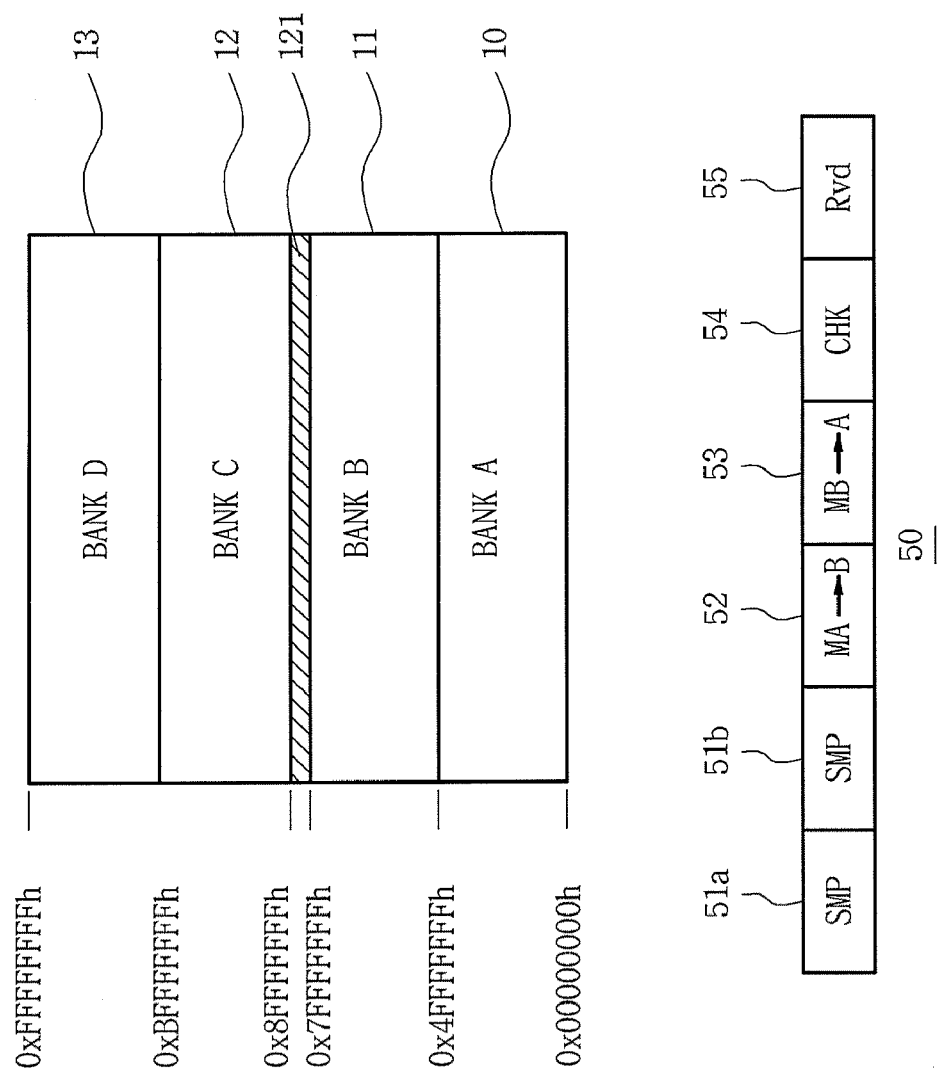
FIG. 5 is a block diagram illustrating an address assignment and substitutive access relation of internal register and memory banks shown in FIG. 4.

A register unit functioning as a data path control unit 50 controls a data path between the shared memory area 11 and the port units 60 and 61 to establish data transmission/reception between the processors 100 and 200 through the shared memory area 11. As shown in FIG. 5 the register unit 50 of FIG. 4 comprises the access authority information unit 51b that is positioned outside the memory cell array and that stores information for an access authority of the flash memory 300.

The register unit 50 is accessed outside the memory cell array instead of a specific area 121 of the shared memory area 11 when a specific address to access the specific area 121 of the shared memory area 11 is applied, and stores data for a control of the data path.

A switching unit 30 is connected to the data path control unit 50, and operationally connects the shared memory area 11 to the first path unit 20 or the second path unit 21 in response to a switching control signal LCON applied through a control line C1.

When the first processor 100 (FIG. 2) connected to the first port 60 accesses the shared memory area 11, lines L1, L10 and L21 adapted among the first path unit 20, switching unit 30 and shared memory area 11 are operationally connected with one another.

Figure 7:
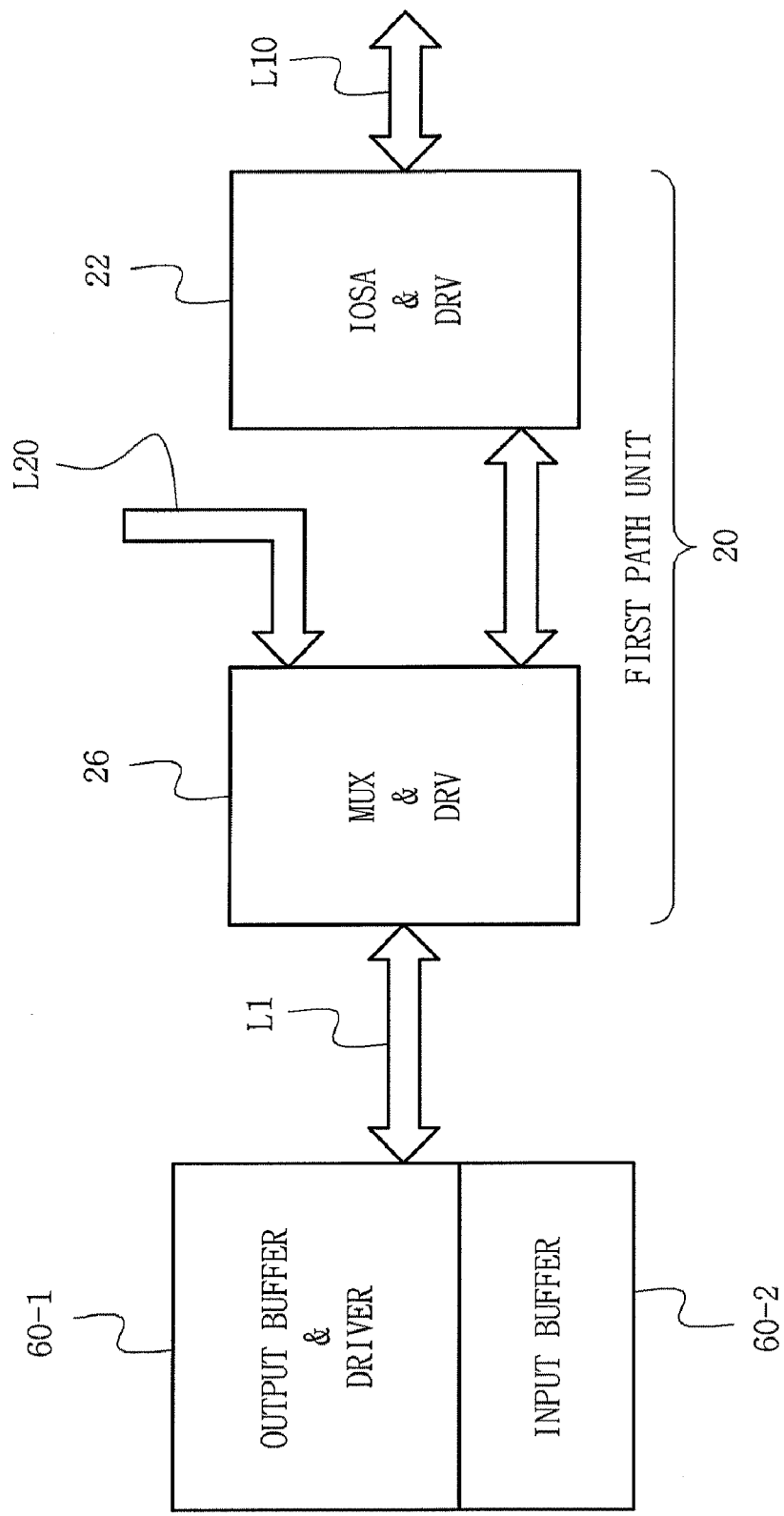
FIG. 7 is a block diagram illustrating an example of connection between first port unit and first path unit shown in FIG. 4.

In FIG. 4, the first path unit 20 switches a line L1 to one of two input/output lines L10 and L20, and may include an input/output sense amplifier and driver 22 and a multiplexer and driver 26 as shown in FIG. 7. Similarly, the second path unit 21 switches a line L2 to one of input/output lines L30, L11 and L31, and may include input/output sense amplifier and driver 22 and multiplexer and driver 26 as shown in FIG. 7.

An interrupt driver 70 may be connected to the register unit 50 and may apply a processor interrupt signal INTi to each processor.

The first processor 100 may be a MODEM processor performing a predetermined modem task, for example, modulation and demodulation of a communication signal. The second processor 200 may be an application processor performing a user convenience function such as a data processing, execution of games or other amusement applications, etc.

FIG. 5 is a block diagram illustrating an address assignment and substitutive access relation of internal register and memory banks shown in FIG. 4. Referring to FIG. 5, it may be assumed that respective banks 10-13 have a capacity of 16 megabits. A specific area of bank B 11 functioning as the shared memory area is set aside as a disabled area 121. For example, a specific row address (0x7FFFFFFFh through 0x8FFFFFFFh, 2 KB size=1 row size) enabling one optional row of the shared memory area 11 comprised of DRAM is changeably assigned to the register unit 50 functioning as an interface unit. Then, when the specific row address (0x7FFFFFFFh through 0x8FFFFFFFh) is applied, a corresponding specific word line 121 of the shared memory area 11 is disabled, but the register unit 50 is enabled. As a result, in an aspect of the system, semaphore areas 51a and 51b and mailbox areas 52 and 53 are accessed using a direct address mapping method, and in an internal aspect, a command approaching to a corresponding disabled address is decoded, thus performing a mapping to a register arranged outside the memory cell array. Thus, a memory controller of chip set produces a command for this area in the same method as other memory cells.

In FIG. 5, access authority information for the shared memory area 11 and the flash memory 300 is stored in respective semaphore areas 51a and 51b. In first and second mailbox areas 52 and 53, message transmitted to mutual corresponding processors from the first and second processors 100 and 200, for example, authority request, address, data size, transmission data indicating an address of shared memory having storage data, or commands, etc., are written. For example, in the first mailbox area 52, a message transmitted from the first processor to the second processor is written, and in the second mailbox area 53, a message transmitted from the second processor to the first processor is written.

The semaphore areas 51a and 51b, the first mailbox area 52 (mailbox A to B) and the second mailbox area 53 (mailbox B to A) may each be assigned 16 bits, and the check bit area 54 may be assigned 4 bits. An area 55 may be assigned 2 bits as a reserve area. The areas 51a, 51b, 52, 53, 54 and 55 can be enabled together by the specific row address, and are each accessed by an applied column address.

The register unit 50 is a data storage area separate from memory cell array that provides an interface between the processors, and is accessed by both the first and second processors. The register unit 50 may be comprised of a flip-flop, and/or a data latch. For example, the register unit 50 may be comprised of a latch type storage cell different from a DRAM memory cell, thus the register unit 50 does not require a refresh operation.

For example, when a data interface between the first and second processors 100 and 200 is obtained through multiport DRAM 410, the first and second processors 100 and 200 may write a message to a corresponding processor by using the mailboxes 52 and 53. The processor that receives the message is able to read the written message and perform its corresponding operation.

As described above, when the processors perform the data communication by utilizing the mailboxes 52 and 53, a host interface may be omitted or substantially reduced, and the resulting system structure becomes compact.

Figure 6:
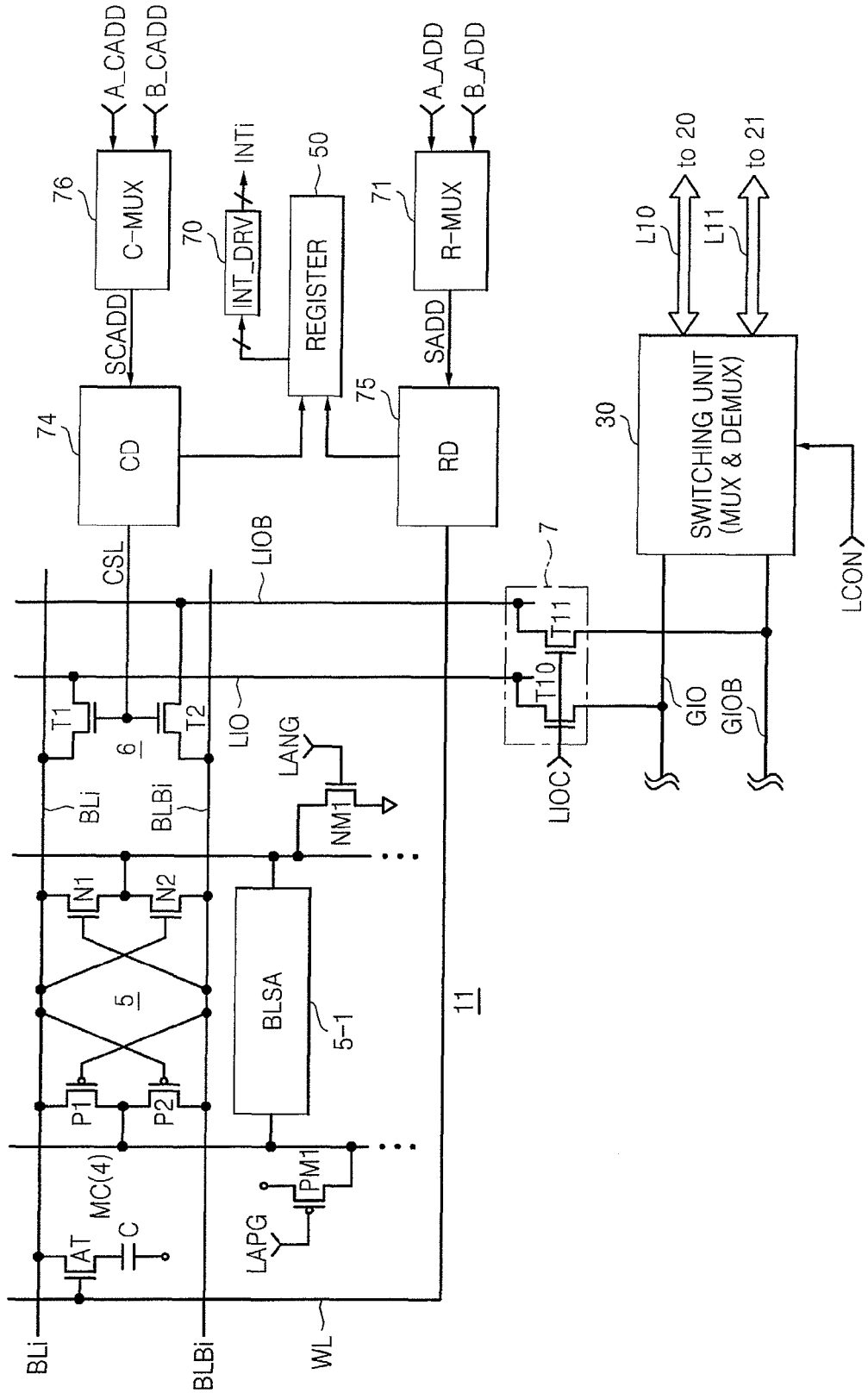
FIG. 6 is a schematic diagram illustrating in detail an example of multipath access to a shared memory area shown in FIG. 4.

FIG. 6 illustrates in detail an example of multipath access to shared memory area shown in FIG. 4. FIG. 7 is a block diagram illustrating in detail an example of connection between first port unit and first path unit shown in FIG. 4, in a configuration with an input/output sense amplifier and driver 22 and a multiplexer and driver 26.

In FIG. 6, a DRAM memory cell 4 belongs to the shared memory area 11 of FIG. 4. With reference to the drawings, the shared memory area 11 is operationally connected to one of first and second path units 20 and 21 through a switching unit 30.

Within the shared memory area 11, the DRAM cell 4 includes one access transistor AT and a storage capacitor C together forming a unit memory device. The DRAM cell 4 is connected with the intersections of pluralities of word lines and bit lines, together forming a bank array matrix. A word line WL shown in FIG. 6 is disposed between a gate of access transistor AT of the DRAM cell 4 and a row decoder 75. The row decoder 75 applies a row decoded signal to the word line WL and the register unit 50 in response to a selection row address SADD of row address multiplexer 71. A bit line BLi constituting a bit line pair is coupled to a drain of the access transistor AT and a column selection transistor T1. A complementary bit line BLBi is coupled to a column selection transistor T2. PMOS transistors P1 and P2 and NMOS transistors N1 and N2 coupled to the bit line pair BLi, and BLBi constitute a bit line sense amplifier 5. Sense amplifier driving transistors PM1 and NM1 each receive a drive signal LAPG, LANG, and drive the bit line sense amplifier 5. A column selection gate 6 comprised of column selection transistors T1 and T2 is coupled to a column selection line CSL transferring a column decoded signal of a column decoder 74. The column decoder 74 applies a column decoded-signal to the column selection line and the register unit 50 in response to a selection column address SCADD of column address multiplexer 76.

In FIG. 6, a local input/output line pair LIO, LIOB is coupled to a first multiplexer 7. When transistors T10 and T11 constituting the first multiplexer 7 are turned on in response to a local input/output line control signal LIOC, the local input/output line pair LIO, LIOB is coupled to a global input/output line pair GIO, GIOB. Then, data of the local input/output line pair LIO, LIOB is transferred to the global input/output line pair GIO, GIOB in a read operating mode. In a write operating mode, write data applied to the global input/output line pair GIO, GIOB is transferred to the local input/output line pair LIO, LIOB. The local input/output line control signal LIOC may be a signal generated in response to a decoded signal output from the row decoder 75.

Read data transferred to the global input/output line pair GIO, GIOB is transferred to a corresponding input/output sense amplifier and driver 22 through one of lines L10 and L11 as shown in FIG. 7. The input/output sense amplifier 22 amplifies data of a sufficiently degraded level as a result of the transfer steps through several data paths. Read data output from the input/output sense amplifier 22 is transferred to first port 60 through multiplexer and driver 26 that constitutes a first path unit 20 together with the input/output sense amplifier 22 as shown in FIG. 7.

When the shared memory area 11 is accessed by the first processor 100, the second processor 200 is disconnected from the line L11, thus an access operation of the second processor 200 to the shared memory area 11 is intercepted. However, in this case, the second processor 200 can access the dedicated memory areas 12 and 13 through second port 61.

In write operation, write data applied through the first port 60 is transferred to the global input/output line pair GIO, GIOB of FIG. 6 sequentially through an input buffer 60-2, multiplexer and driver 26, input/output sense amplifier and driver 22 and the switching unit 30 of FIG. 7. When the first multiplexer 7 is activated, the write data is transferred to local input/output line pair LIO, LIOB and is stored in a selected memory cell 4.

An output buffer and driver 60-1 and input buffer 60-2 shown in FIG. 7 may correspond to or be included in the first port 60 of FIG. 4. Further, input/output sense amplifier and driver 22 and multiplexer and driver 26 may correspond to or be included in first path unit 20 of FIG. 4. The multiplexer and driver 26 prevents one processor from accessing to simultaneously access the shared memory area 11 and dedicated memory area 10.

As described above, in a semiconductor memory device according to an exemplary embodiment of the present invention having the detailed configuration as shown in FIG. 6, a DRAM interface function between processors 100 and 200 can be attained since two processors can each access the same shared memory area 11. Furthermore, the processors 100 and 200 can perform a data communication through the commonly accessible shared memory area by using the register unit 50 functioning as an interface unit.

Figure 8:
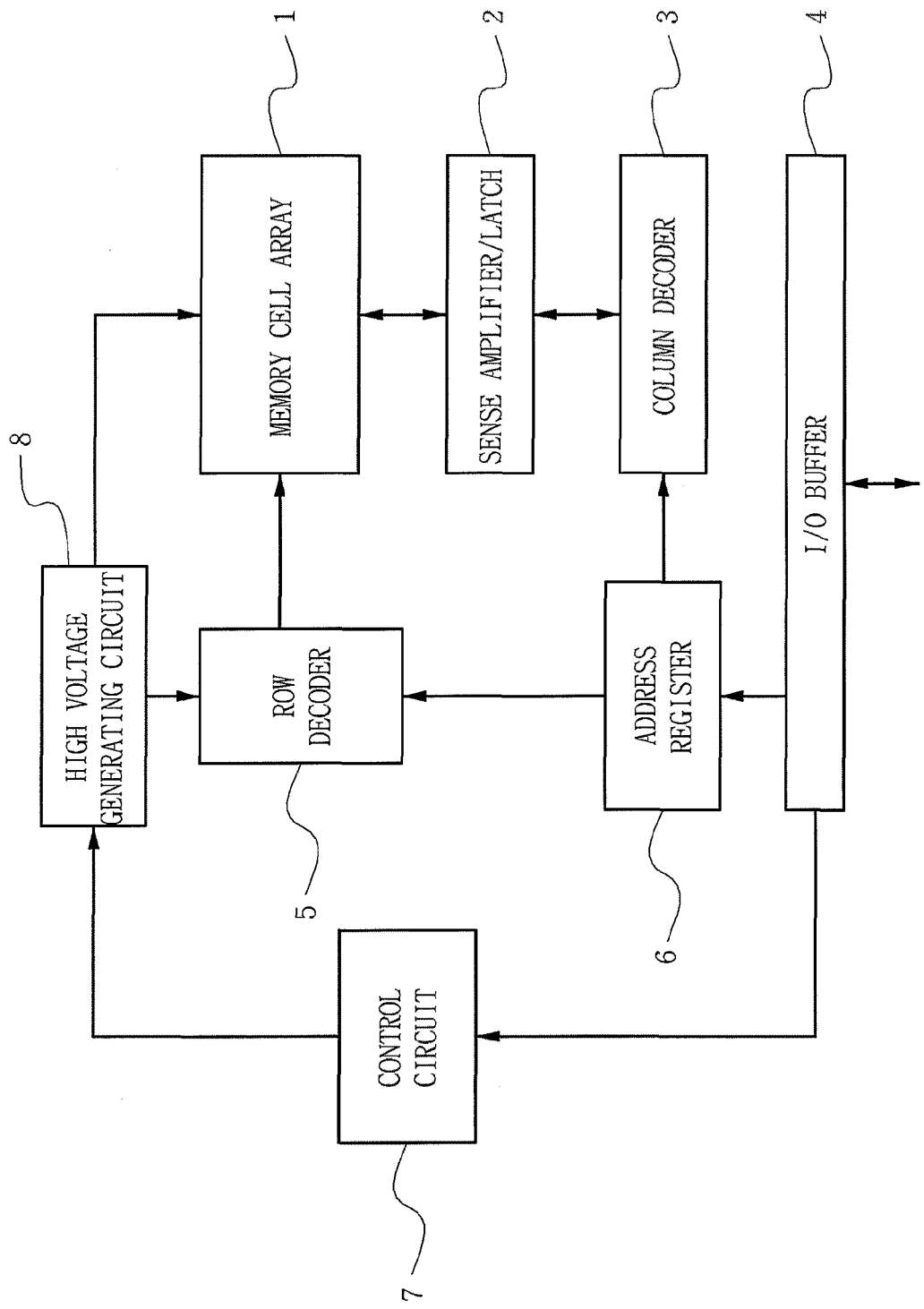
FIG. 8 is a block diagram illustrating a nonvolatile memory shown in FIG. 2.
Figure 9:
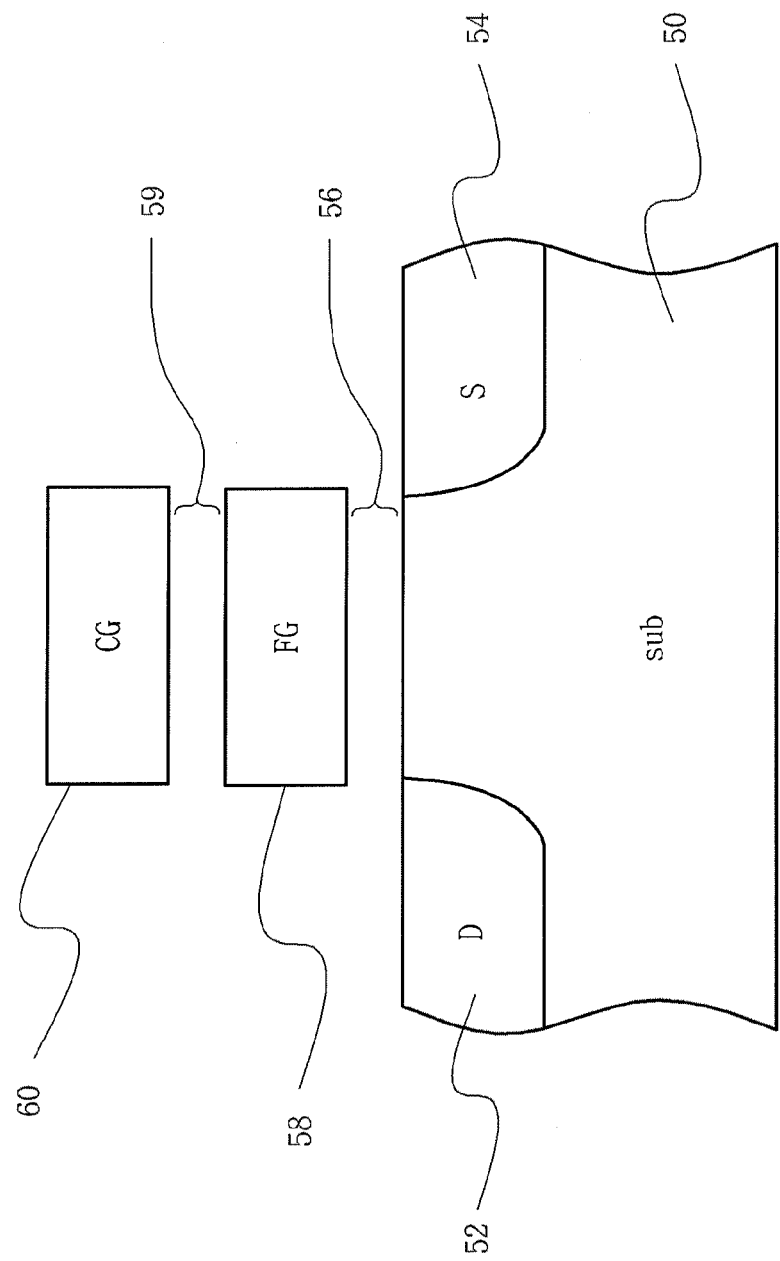
FIG. 9 is a schematic diagram illustrating a structure of unit memory cells constituting a memory cell array shown in FIG. 8.
Figure 10:
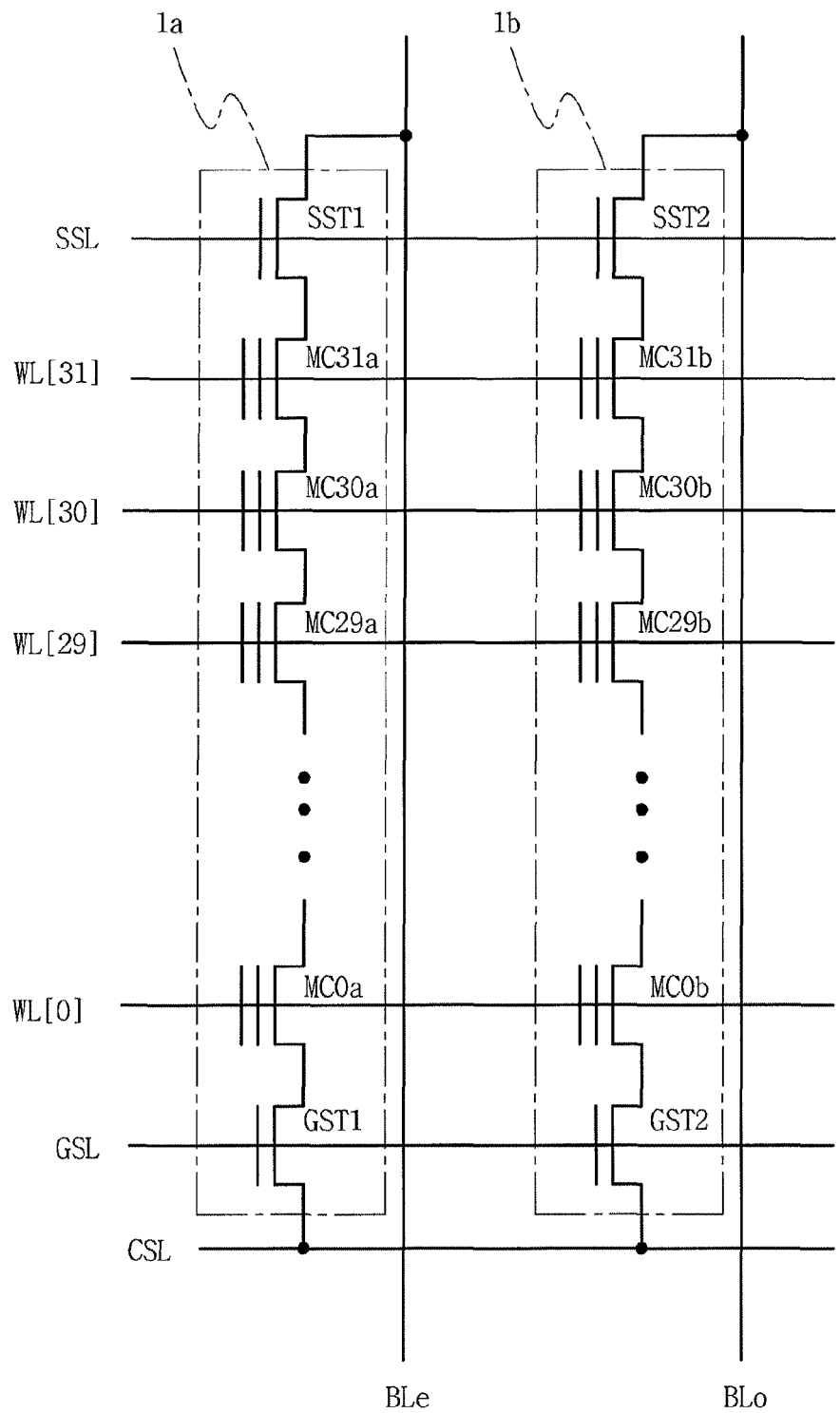
FIG. 10 is a schematic diagram illustrating an example of NAND type memory cell array with a string-type layout of unit memory cells shown in FIG. 9.

FIG. 8 is a block diagram of nonvolatile memory shown in FIG. 2. FIG. 9 illustrates a structure of unit memory cell constituting a memory cell array shown in FIG. 8. FIG. 10 illustrates an example of NAND type memory cell array with a string type layout of unit memory cells shown in FIG. 9.

In FIG. 8 a block connection structure of NAND type flash EEPROM is shown. The EEPROM includes a memory cell array 1, sense amplifier and latch 2, column decoder 3, input/output buffer 4, row decoder 5, address register 6, high voltage generating circuit 8 and control circuit 7. The sense amplifier and latch 2 may sense and store input/output data of memory cell transistors, and the column decoder 3 may select bit lines, and the row decoder 5 may select word lines. The address register 6 may store addresses, and the high voltage generating circuit 8 may generate high voltage higher than operation power voltage for a program or erase operation. The control circuit 7 may control an operation of nonvolatile semiconductor memory.

The memory cell array 1 may be configured in a NAND type as shown in FIG. 10. FIG. 10 is an equivalent circuit diagram illustrating a connection structure for memory cells of the memory cell array 1. The memory cell array 1 comprises a plurality of cell strings (NAND cell units). A first cell string 1a is connected to an even bit line BLe and a second cell string 1b is connected to an odd bit line BLo.

The first cell string 1a comprises a string selection transistor SST1 whose drain is connected to a bit line BLe, a ground selection transistor GST1 whose source is coupled to a common source line CSL, and a plurality of memory cell transistors MC31a, MC30a, . . . , MC0a whose drain-source channels are connected in series between a source of the string selection transistor SST1 and a drain of the ground selection transistor GST1. Similarly, the second cell string 1b comprises a string selection transistor SST2 whose drain is connected to a bit line BLo, a ground selection transistor GST2 whose source is coupled to a common source line CSL, and a plurality of memory cell transistors MC31b, MC30b, . . . , MC0b whose drain-source channels are connected in series between a source of the string selection transistor SST2 and a drain of the ground selection transistor GST2.

A signal applied to a string selection line SSL is supplied to both gates of the string selection transistors SST1 and SST2, and a signal applied to a ground selection line GSL is supplied to both gates of the ground selection transistors GST1 and GST2. Word lines WL[0]-WL[31] are coupled to each of the control gates of memory cell transistors belonging to the same row. Bit lines BLe and BLo are operationally connected to the sense amplifier and latch 2 of FIG. 8 and are formed in a layer different from a layer of the word lines WL[0]-WL[31] to cross the word lines. The bit lines are disposed in parallel with one another in the layer.

The optional memory cell transistor shown in FIG. 10 is comprised of a MOS transistor having a floating gate 58 below a control gate 60 as shown in FIG. 9.

Unit memory cells include a MOS transistor having a charge-storage floating gate, for example, as described below and shown in FIG. 9.

Erase, write and read operations for NAND-type EEPROMs are described below. The erase and program (write) operation can be attained by using an F–N tunneling current. For example, in the erase, a high potential is applied to a substrate 50 shown in FIG. 9 and a low potential is applied to the CG (Control Gate) 60 of the memory cell transistor. In this case, potential decided by a coupling ratio for a capacitance between CG 60 and FG (Floating Gate) 58 (across the gap 59) and a capacitance between the FG 58 and the substrate 50 (across the gap 56) is applied to the FG 58. When a potential difference between a floating gate voltage Vfg applied to the FG 58 and a substrate voltage Vsub applied to the substrate 50 is greater than a potential difference creating an F–N tunneling, electrons gathered in the FG 58 move to the substrate 50 from the FG 58. Such operation lowers a threshold voltage Vt of a memory cell transistor constructed of CG 60, FG 58, a source 54 and a drain 52. Even when the Vt is sufficiently lowered such that 0 V is applied to the CG 60 and the source 54, and when an appropriate positive high voltage is applied to the drain 52; current flows and the cell may be called "ERASED," a state that is logically represented as '1'.

In the write (program) operation, 0V is applied to source 54 and drain 52 and a high voltage is applied to CG 60. An inversion layer is formed in a channel region and the source and drain both have a potential of 0V. A potential Vfg to be applied to the floating gate 58 is determined by a rate of capacitances between CG and FG and between FG and the channel region. If a potential difference Vfg and Vchannel (0 V) is sufficiently large, F–N tunneling is created such that electrons move from the channel region to the FG 58. Accordingly, Vt increases, and when a predetermined positive voltage is applied to the CG 60, 0V is applied to the source 54, and an appropriate positive voltage is applied to the drain 52 such that current does not flow and the cell may be called "PROGRAMMED," a state that is logically represented as '0'.

In a memory cell array having a plurality of cell strings such as the first and second cell strings, a page of memory cells is made up of memory cell transistors in which control gates are each connected to the same word line. Multiple pages may include a plurality of memory cell transistors and may together form a cell block. One cell block generally includes one or more cell strings per bit line. NAND flash memory has a page program mode for a high speed programming. A page program mode is classified as a data loading operation and a program operation. The data loading operation sequentially latches and stores one byte of data in each data register from input/output terminals. Data registers are adapted corresponding to respective bit lines. The program operation writes in a single step, data stored in the data registers, to memory transistors on a word line selected through bit lines.

In the NAND-type EEPROM described above, read operations and program operations are generally performed by the page. Erase operations are performed by the block. Electron movement between a channel and an FG of the memory cell transistor is performed in program and erase operations. In read operations, after the erase and program operations are completed, intact data stored in memory cell transistor is read without damaging the data.

In the read operation, a voltage for example, a read voltage, higher than a selection read voltage Vr applied to CG of a selected memory cell transistor is applied to a CG of non-selected memory cell transistor. Then, current flows or does not flow in a corresponding bit line according to a program state of the selected memory cell transistor. When a threshold voltage of a programmed memory cell is higher than a reference value under a predetermined voltage condition, the memory cell is determined to be an off-cell, thus charging a corresponding bit line to voltage of a high level. When a threshold voltage of programmed memory cell is lower than a reference value, the memory cell is determined to be an on-cell, and a corresponding bit line is discharged to a low level. The state of the bit line is thus read out as '0' or '1' through a sense amplifier 2 called the page buffer.

An erase operation is initially performed on the memory cell transistors of the cell string so that a threshold voltage of, for example, about −3V or below is achieved. When programming a memory cell transistor, a high voltage is applied to a word line of a selected memory cell for a given time. The selected memory cell is changed to a relatively high threshold voltage. The threshold voltages of the non-selected memory cells are not changed during programming.

A booting operation according to an exemplary embodiment of the present invention is described below with reference to the accompanied drawings.

Referring to FIG. 2, steps of directly accessing the flash memory 300 in an initial operation of the system by the first processor 100 and then performing a direct booting are described below.

When a power-on is performed in a multiprocessor system with the configuration described above with reference to in FIG. 2, a booting operation of the second processor 200 is performed. In this case, the second processor 200 accesses a second access area 320 of the flash memory 300 through a bus line B4 and a bus line B5. Then, boot code data stored within the second access area 320 of the flash memory 300 is loaded into the second processor 200, thus the booting operation of the second processor 200 is completed. The second processor 200 writes flag data "01" in the second semaphore 51b shown in FIG. 2 after the booting operation has completed as described above with reference to FIG. 3. At this time, an access authority for the flash memory 300 is given over to the first processor 100. A first access area 310 of the flash memory 300 is operationally connected to the first processor 100 through the bus line B5 and the bus line B3 according to a data change of the second semaphore 51b. Thus, boot code data stored in nonvolatile in the first access area 310 is directly loaded into the first processor 100 and so a booting operation of the first processor 200 is performed.

Accordingly, a serial interface adapted between application processor 200 and MODEM processor 100 is not required and may be omitted. Moreover, according to this approach, it is not necessary to copy modem operating system code from the flash memory to the shared memory area prior to boot up. By omitting these steps, data transmission speed may be increased.

Communication code updated during booting of the MODEM processor 100 may be stored in the manner described below after the booting is completed. After the booting operation is completed, the second processor 200 generally goes into a sleep mode to conserve power. In this case, immediately before the second processor 200 has gone into the sleep mode, the second processor 200 writes flag data "01" to the second semaphore 51b. Accordingly, the access authority for the flash memory 300 is in the first processor 100. In this case, without waking up the second processor 200, the first processor 100 directly writes the communication code updated during operation to the flash memory 300. The writing of the updated communication code to the flash memory 300 may be performed by a program operation. The program operation includes injecting electrons into a floating gate 58 of FIG. 9, as described above with reference to FIGS. 8 to 10.

Similarly, in the direct writing operation, data of the second semaphore 51b is "01", the first access area 310 of the flash memory 300 is operationally connected to the first processor 100 through the bus line B5 and the bus line B3. Thus, in the first access area 310 of the flash memory 300, communication code updated during operation by the first processor 100 is directly stored and is not routed through the second processor 200.

Accordingly, the communication code is not indirectly written to a code storage area of flash memory 300 and problems associated with such an approach may be avoided. Further, the direct write operation does not require that the application processor 200 be awoken from the sleep mode, thereby further conserving power and increasing reliability and security of the system.

As described above, according to exemplary embodiments of the present invention, a host interface is not required to share memory between multiple processors and all processors may be directly booted without having to copy boot code between multiple memory locations, and data may be directly written to a nonvolatile memory by any of the multiple processors.

Furthermore, in a multiport semiconductor memory device according to an exemplary embodiment of the present invention, a processor indirectly connected to a nonvolatile memory can directly access the shared nonvolatile memory. Accordingly, a host interface is not necessary and may be omitted, direct booting and direct storage of code data can be efficiently obtained, booting performance may be increased, and power consumption may be reduced. In addition, reliability and security of the system increases and access collision between processors trying to access the shared nonvolatile memory can be prevented.

In a multiprocessor system according to an exemplary embodiment of the present invention, the system may include two or more processors. In the multiprocessor system, the processors may be microprocessors, CPUs, digital signal processors, micro controllers, reduced-command set computers, complex command set computers, modem processors or the like. Although exemplary embodiments have been described with two processors, more processors may be used. Further, the scope of the invention is not limited to any special combination of processors in adapting the same or different processors as the exemplary embodiments described above. For example, although exemplary embodiments of the present invention are described as having a modem processor, it is not required that any of the multiple processors be a modem processor.

It will be apparent to those skilled in the art that modifications and variations can be made to the disclosed exemplary embodiments without deviating from the spirit or scope of the invention.

For example, the configuration for a shared memory bank of multiport semiconductor memory or the configuration of semaphore, or circuit configuration and access method may be diversely changed.

In addition, a control of the data path between the shared memory area and the port units can be realized through various methods. The configuration of semaphore using a register has been described above, but without limiting to that, a technical spirit of the invention may be extended to other nonvolatile memories such as PRAM etc. In the drawings and specification, there have been disclosed exemplary embodiments of the present invention.

What is claimed is:

1. A multiport semiconductor memory device comprising:
a plurality of port units;
a plurality of processors, each of which corresponds to and is coupled to one of the plurality of port units;
a memory cell array comprising a shared memory area which can be directly accessed by each of the plurality of processors through the corresponding port units;
a data path control unit controlling a data path between the shared memory area and each of the plurality of port units to perform data transmission/reception between each of the plurality of processors through the shared memory area; and
an access authority information storage unit positioned outside of the memory cell array and comprising a first semaphore area and a second semaphore area, the first semaphore area storing access authority information for the shared memory area, the second semaphore area storing access authority information for accessing a nonvolatile memory, and the access authority information storage unit providing the stored access authority information to each of the plurality of processors.

2. The device of claim 1, wherein the memory cell array further comprises a plurality of dedicated memory areas which include one or more dedicated memory areas for each processor and each are accessed only by its respective processor.

3. The device of claim 1, wherein the data path control unit is positioned outside of the memory cell array, and comprises an internal register which can be accessed by all of the processors.

4. The device of claim 3, wherein the internal register is comprised of a latch type register and the latch type register is accessed instead of a specific area of the shared memory area when a specific address to access the specific area of the shared memory area is applied, the latch type register storing data for controlling the data path.

5. The device of claim 3, wherein the internal register comprises a semaphore area for storing a control authority of the shared memory area, and a plurality of individually assigned mailbox areas corresponding to each of the plurality of processors, storing messages for the respective processors relating to a direction of data transmission.

6. The device of claim 1, wherein the nonvolatile memory is a NAND or NOR type flash memory.

7. A multiprocessor system comprising:
a first processor for performing a first task;
a second processor for performing a second task;
a nonvolatile memory directly connected to each of the first and second processors, storing a firmware related to the first and second processors; and
a multiport semiconductor memory device including a first port unit connected to the first processor and a second port unit connected to the second processor, a memory cell array comprising a shared memory area which can be accessed by each of the first and second processors through the respective port units, a data path control unit controlling a data path between the shared memory area and each of the port units to perform data transmission/reception between the first and second processors through the shared memory area, and an access authority information storage unit positioned outside of the memory cell array, storing access authority information for accessing the nonvolatile memory and providing the stored access authority information to each of the first and second processors,
wherein the data path control unit comprises an internal register positioned outside of the memory cell array and accessed by both the first and second processors,
wherein the internal register comprises a semaphore area for storing a control authority of the shared memory area, and first and second mailbox areas corresponding to the first and second processors, respectively, storing messages for the respective processors relating to a direction of data transmission, and
wherein when the internal register is accessed by a specific address, memory cells coupled to a specific word line of the shared memory are all disabled.

8. The system of claim 7, wherein the first task comprises a communication modulation/demodulation function.

9. The system of claim 7, wherein the second task comprises processing application information.

10. The system of claim 8, wherein the multiprocessor system is a mobile phone, a personal media player (PMP), or a personal digital assistant (PDA).

11. The system of claim 7, wherein the memory cell array includes a first dedicated memory area accessed by the first processor and a second dedicated memory area accessed by the second processor.

12. The system of claim 7, wherein the access authority information storage unit is comprised of an internal register positioned outside of the memory cell array and accessed by both the first and second processors.

13. The system of claim 7, wherein the internal register is comprised of a latch type register and the latch type register is accessed instead of a specific area of the shared memory area when a specific address to access the specific area of the shared memory area is applied, the latch type register storing data for controlling the data path.

14. The system of claim 12, wherein the internal register is comprised of a semaphore area for storing a control authority of the nonvolatile memory.

15. The system of claim 7, wherein the nonvolatile memory is an EEPROM or a PRAM.

16. A method of accessing a nonvolatile semiconductor memory device in a multiprocessor system including a nonvolatile memory and a multiport semiconductor memory device, the nonvolatile memory and the multiport memory each directly connected to a first processor performing a first task and a second processor performing a second task, the method comprising:

preparing a first port unit connected to the first processor and a second port unit connected to the second processor, a memory cell array comprising a shared memory area which can be directly accessed by the first and second processors through the corresponding port units, and a first storage unit and a second storage unit, each of a latch type, individually storing access authority information for accessing the multiport semiconductor memory device and the nonvolatile memory, the first and second storage units being positioned outside the memory cell array;

allowing the second processor to access the nonvolatile semiconductor memory device, to be booted, and to write information on transfer of access authority to the second storage unit of the multiport semiconductor memory device; and allowing the first processor to directly access the nonvolatile semiconductor memory device, to be booted, and to store data without utilizing the second processor after the booting of the first processor has been completed.

17. The method of claim 16, wherein the data of the first processor is MODEM code data.

* * * * *